United States Patent
Hu et al.

[11] Patent Number: 6,100,189
[45] Date of Patent: *Aug. 8, 2000

[54] SECOND IMPLANT FOR AGGLOMERATION CONTROL

[75] Inventors: Yong-Jun Hu; Pai-Hung Pan; Mark Klare, all of Boise, Id.

[73] Assignee: Micron Technology, Inc., Boise, Id.

[ * ] Notice: This patent is subject to a terminal disclaimer.

[21] Appl. No.: 09/057,908

[22] Filed: Apr. 9, 1998

Related U.S. Application Data

[60] Continuation of application No. 08/959,238, Oct. 28, 1997, Pat. No. 5,856,698, which is a division of application No. 08/764,685, Nov. 27, 1996, Pat. No. 5,739,064.

[51] Int. Cl.[7] .......................... H01L 21/44; H01L 21/425
[52] U.S. Cl. ................................ 438/659; 438/528
[58] Field of Search .................... 438/659, 528, 438/655, 527

[56] References Cited

U.S. PATENT DOCUMENTS

| | | | |
|---|---|---|---|
| 4,604,641 | 8/1986 | Konishi | 257/379 |
| 4,682,407 | 7/1987 | Wilson | 438/517 |
| 4,683,645 | 8/1987 | Naguib et al. | 437/41 |
| 4,897,368 | 1/1990 | Kobushi et al. | 437/200 |
| 5,103,272 | 4/1992 | Nishiyama | 257/388 |
| 5,313,087 | 5/1994 | Chan et al. | 257/538 |
| 5,384,485 | 1/1995 | Nishida et al. | 257/751 |
| 5,429,972 | 7/1995 | Anjum et al. | 438/398 |
| 5,633,177 | 5/1997 | Anjum | 438/301 |
| 5,637,533 | 6/1997 | Choi | 438/643 |
| 5,705,429 | 1/1998 | Yamaha et al. | 438/653 |
| 5,739,064 | 4/1998 | Hu et al. | 438/528 |
| 5,776,823 | 7/1998 | Agnello et al. | 438/592 |
| 5,851,922 | 12/1998 | Bevk et al. | 438/655 |
| 5,861,340 | 1/1999 | Bai et al. | 438/655 |
| 5,874,351 | 2/1999 | Hu et al. | 438/655 |

*Primary Examiner*—Brian Dutton
*Attorney, Agent, or Firm*—Workman, Nydegger & Seeley

[57] ABSTRACT

A semiconductor device on a semiconductor wafer and the devices made by the method, wherein improvements are realized to agglomeration control, resistivity, and thermal stability of a titanium disilicide layer on a polysilicon layer. Agglomeration control is achieved through the use of two carefully selected low dose barrier diffusion matrix implants into the polysilicon layer, one of which is situated at an interface between the layer of polysilicon and the resultant layer of titanium disilicide film after heat treatment, and the other of which is near the surface of the resultant layer of titanium disilicide film after heat treatment.

30 Claims, 1 Drawing Sheet

SECOND IMPLANT FOR AGGLOMERATION CONTROL

RELATED APPLICATION

This is a continuation patent application of U.S. patent application Ser. No. 08/959,238 filed on Oct. 28, 1997, now U.S. Pat. No. 5,856,698 which is a divisional patent application of U.S. patent application Ser. No. 08/764,685 filed on Nov. 27, 1996, now U.S. Pat. No. 5,739,064 both of which are incorporated herein by reference.

BACKGROUND OF THE INVENTION

1. The Field of the Invention

The present invention relates the manufacture of semiconductor devices. More particularly, the present invention relates to a semiconductor wafer having semiconductor devices thereon, the semiconductor wafer having a substrate subjected to a series of processing steps for forming silicide films on monocrystalline amorphous, or polycrystalline silicon, the processing steps serving to reduce interfacial failures on the wafer due to agglomeration within the silicide films during high temperature anneal processing steps.

2. The Relevant Technology

As is well known in the art, polycrystalline silicon (polysilicon) is a preferred material for gate electrodes in MOSFET structures. Polysilicon is advantageous over metal gate electrodes because it can withstand much higher subsequent processing temperatures before eutectic temperatures are reached. Polysilicon can be deposited on bulk silicon or $SiO_2$ using low pressure chemical vapor deposition (LPCVD).

As the drive toward integrating more active devices on a single integrated circuit necessitates the fabrication of increasingly smaller MOSFET structures, the resistance of the MOSFET gate becomes a limiting factor in device speed. As such, it is beneficial to use materials with the lowest possible sheet resistivities for making contact with the polysilicon gate structure. To this end it is well known that refractory metal suicides can be readily formed on polysilicon MOSFET gate structures using conventional semiconductor deposition and annealing techniques. The refractory metal suicides have low sheet resistivities after annealing and also form low resistance ohmic contacts with commonly used interconnect metals. The resistance of the silicide/polysilicon structures and their overall integrity are greatly affected by the manner in which the structures are processed.

Titanium silicide ($TiSi_2$) has a low sheet resistivity when it has been annealed to a C54 phase. To obtain the desired low resistivities requires high temperature annealing in the range of 700° C.–1100° C. Numerous techniques for creating and annealing $TiSi_2$ films on MOSFET gate source and drain electrodes are known, and for obtaining the desired low sheet resistivities. The most common of these techniques involves depositing either pure titanium metal, or co-depositing titanium silicide ($TiSi_2$), with subsequent annealing steps to convert the deposited layer to $TiSi_2$ in a C54 phase.

The use of $TiSi_2$ in silicon gate MOSFET fabrication is becoming limited by insufficient process stability at the desired processing temperatures. This instability creates a problem as the trend toward more complex integrated circuits necessitates an increasing number of high temperature processing steps after the deposition and formation of the silicide layer. An unwanted side effect of the high temperature instability of $TiSi_2$ is caused by agglomeration, which is known to occur during high temperature polysilicon processing. Agglomeration is a build-up of re-crystallized silicon, metal, or dopant grains at either or both of the interfaces of the polysilicon layer, and typically occurs during high-temperature annealing. Although the mechanisms of agglomeration are complex and varied, it is widely accepted that a major contributing factor to agglomeration is the action of polysilicon grain boundaries as rapid diffusion routes for transporting silicon and/or dopant ions which diffuse out from the polysilicon during annealing. Silicon which out-diffuses from the polysilicon layer and then recrystallizes at the $TiSi_2$-polysilicon interface can cause severe discontinuities and voids within the $TiSi_2$ layer, resulting in higher sheet resistivity of the silicide with greater variation in resistivity and a greater number of defects.

As it is known in the art that high-temperature annealing is required to achieve the minimum possible room-temperature resistivity of any given silicide, it is clear that advances are needed which will better control the mechanical and electrical stability of refractory metal silicide films (e.g $TiSi_2$) during high-temperature silicide formation and annealing. Accordingly, it would be an advance in the art to avoid agglomeration, develop superior sheet resistivity and device speed, and increase thermal stability characteristics in refractory metal silicide films.

SUMMARY OF THE INVENTION

Processing steps that overcome the above-mentioned side effects of high-temperature annealing are part of a semiconductor fabrication method of the present invention. A silicon layer, either monocrystalline silicon, amorphous silicon or polysilicon, is deposited on a silicon substrate. A first diffusion barrier matrix is implanted at a specific depth within the silicon layer. A second diffusion barrier matrix is implanted at the surface of the silicon layer. A layer of refractory metal is sputtered on the silicon layer and then a first salicidation anneal is performed at high a temperature. The refractory metal that does not form metal silicide is selectively etched and a second salicidation anneal is performed at a high temperature.

As will be shown in the sections that follow, by proper selection of the elements, concentrations, and implant depths of the above mentioned diffusion barrier matrices, refractory metal silicide, polycide, and salicide structures can be created. The first diffusion barrier matrix is implanted at a depth within the polysilicon layer where the interface between the refractory metal silicide and the polysilicon will be. This has the effect that the refractory metal silicide layer will not break down at the interface of the polysilicon layer into silicon and the refractory metal. The implanting of the second diffusion barrier matrix at the surface of the polysilicon layer controls salicidation to produce a smooth refractory metal silicide film on the surface. As result of this method the structure has superior resistivity and thermal stability characteristics.

These and other aspects of the invention will become apparent to those skilled in the art after referring to the following description and examples.

BRIEF DESCRIPTION OF THE DRAWINGS

In order that the manner in which the above-recited and other advantages and objects of the invention are obtained may be more fully explained, a more particular description of the invention briefly described above will be rendered by reference to specific embodiments and applications thereof

DETAILED DESCRIPTION OF THE PREFERRED EMBODIMENTS

Additional advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

An invention of processing steps is disclosed which significantly reduce the resistivity and increase thermal stability of annealed refractory metal silicide films. The processing steps reduce agglomeration at the interface of the refractory metal silicide film and an underlying layer of polysilicon or silicon.

The processing steps are useful as part of a general method for fabrication of MOSFET structures, a preferred embodiment of which is disclosed below. In the following description, numerous details are set forth, such as specific materials, process parameters, etc., in order to provide a thorough understanding of the present invention. It will be obvious to one skilled in the art, however, that these specific details need not be employed precisely as described to practice the present invention. In other instances, well-known processing steps are not described in detail so as not to detract from the various details of the embodiments of the invention.

Figure 1:
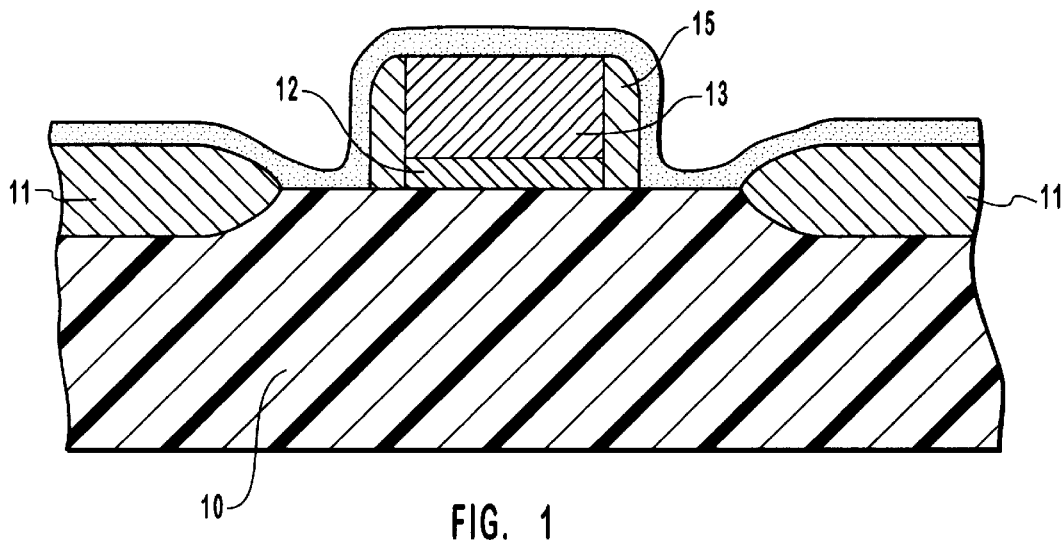
FIGS. 1–3 are simplified cross sectional schematics showing an example of the developments of a MOSFET gate structure as pertains to this invention.

In an embodiment of the present invention, referring to FIG. 1, a thermally grown field oxide film 11 is formed on a P-type or N-type silicon substrate 10 with exposed active areas corresponding to the geometries of the MOSFET structures that are to be fabricated. After cleaning, an insulating film 12, typically $SiO_2$, is grown on the entire exposed surface of the substrate. A polysilicon layer 13 is then deposited over the insulating film, preferably using LPCVD. Other methods for depositing polysilicon layer include PECVD (pressure enhanced chemical vapor deposition), APCVD (atmospheric pressure chemical vapor deposition), and sputtering. Polysilicon layer 13 is formed according to one of the foregoing processes at a temperature preferably in a range from about 50° C. to about 900° C.

Figure 2:
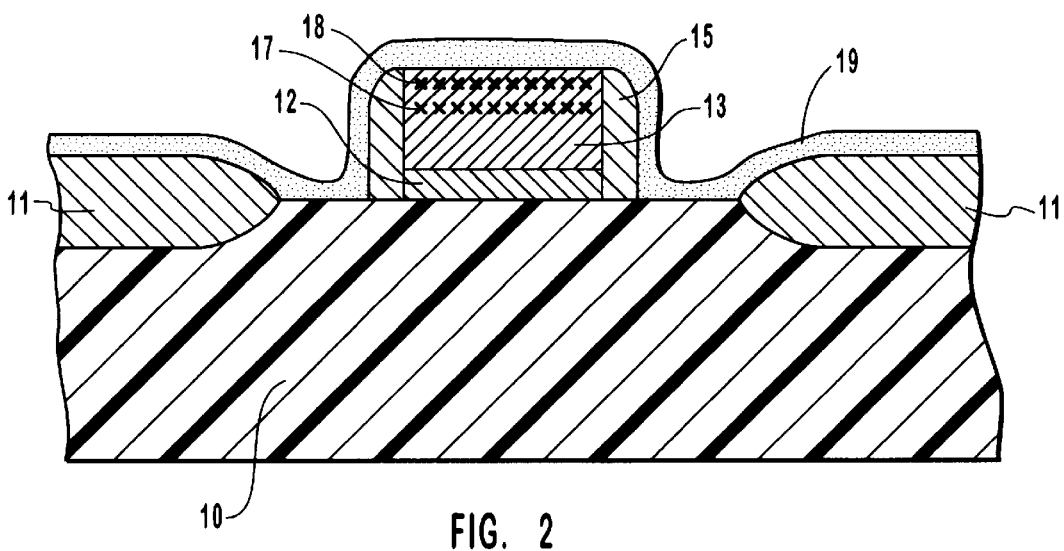

Referring to FIG. 2, a first diffusion barrier matrix 17 is then implanted within polysilicon layer 13 with nitrogen. First diffusion barrier matrix 17 is implanted at a predetermined depth range corresponding to where the interface will be situated between polysilicon layer 13 and a layer of titanium silicide to be formed after a subsequent annealing step. In the preferred embodiment, first diffusion barrier matrix 17 is a $2\times10^{13}$ $cm^{-2}$ $N^+$ implant dose at an energy of about 22 KeV, although other dopants such as phosphorus, or metals such as molybdenum, tungsten, or cobalt could also be used. Other dopant concentrations could also be used but a low dose close to the value stated herein is preferable. First diffusion barrier matrix 17 is used to limit the diffusion of silicon along columnar grain boundaries which form in the polysilicon layer during annealing. Ion implantation is conducted by providing an ion source from which the implanted ions are generated. The ion source may be, for example, phosphorus, nitrogen, or other materials contemplated by the invention.

The wafer is then patterned and insulating film 12 and polysilicon layer 13 are etched to form a polysilicon gate structure consisting of a gate oxide layer 12 and a polysilicon gate layer 13. Insulating side wall spacers 15 are then formed by conventional processing.

A second matrix 18 is then implanted in the surface. Second matrix 18 may comprise, for example, nitrogen ions. Alternatively, other materials, such as phosphorus ions, molybdenum ions, tungsten ions, or cobalt ions may be used in second matrix 18. The primary function of this step is to control salicidation and for silicide surface smoothing on the surface. The first and second implanted matrixes assist a smooth silicide/polysilicon interface and a smooth silicide surface, respectively.

A metallization layer 19 of Ti material is next deposited on polysilicon layer 13 using a standard PVD process. The PVD process is conducted in a temperature range of between 100° C. and 300° C. Alternatively, metallization layer 19 may also be a refractory metal material that is next deposited on polysilicon gate layer 13 preferably using a standard PVD process. Refractory metal materials according to the present invention include at least titanium, tungsten, cobalt, and molybdenum and combinations thereof.

The structure is then subjected to a salicidation anneal. A first salicidation anneal is performed in nitrogen at 750° C. for 20 seconds. A conventional blanket etch is then performed to remove all unreacted titanium metal from the top layer that did not form polycide or salicide structures. A second salicidation anneal is then performed in nitrogen at 825° C. for 10 seconds to fully convert all of the remaining silicide structures to the C54 phase. Alternatively, the anneals may be conducted according to other process parameters. For example, an anneal may include rapid thermal processing at about 1,000° C. for about 20 seconds.

Figure 3:
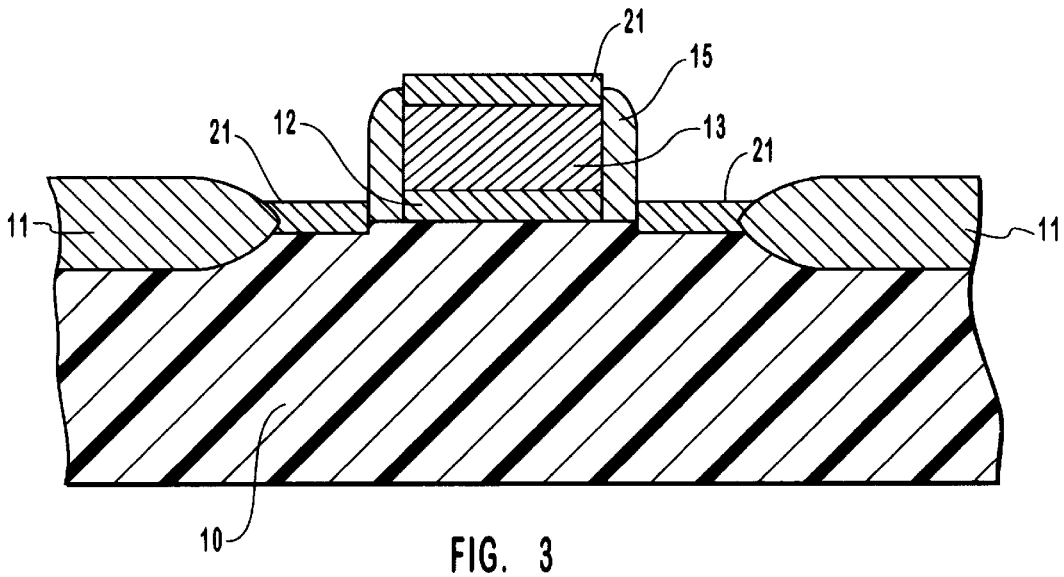

The overall finished MOSFET gate structure appears as shown in FIG. 3. Metallization layer 19 of FIG. 2 has combined with polysilicon gate layer 13 to form a polycide gate layer 21, on top of unreacted silicon. The gate structure includes active regions that form source and drain regions. Results of the foregoing steps reveal a smooth film surface and a smooth interface as demonstrated by resistivity tests. In a preferred embodiment of the present invention, field oxide film 11 has a thickness in a range from about 1,000 Å to about 3,000 Å, insulating film 12 has a thickness in a range from about 50 Å to about 150 Å, polysilicon layer 13 has a thickness in a range from about 1,000 Å to about 2,000 Å, and refractory metal silicide layer 21 has a thickness in a range from about 500 Å to about 2,000 Å. In a preferred embodiment, first diffusion barrier matrix 17 is implanted in polysilicon layer 13 at a predetermined depth in a range from about 200 Å to about 1,000 Å.

EXAMPLES

The following examples are provided for illustration purposes and are not intended to be restrictive of the scope and spirit of the present invention. Table A illustrates a series of tests in which one or more ion dopant implantations were made previous to forming into a structure of a layer of $TiSi_2$ above and on a layer of polysilicon, the layer of polysilicon being above and on a gate oxide that is in turn above and on a P-type silicon substrate. In the Test Nos. 1–3, second and first implant matrices were implanted, respectively, into the polysilicon layer at the surface and the eventual $TiSi_2$-polysilicon interface. Table A illustrates that Tests Nos. 1–3 demonstrate a controlled low-level resistivity. A series of comparative examples (Tests Nos. C1–C7) illustrate that single implant at the surface of the polysilicon, while controlling salicidations of $TiSi_2$, do not achieve the desired low resistivity.

TABLE A

| Test No. | $TiSi_x$ depth, angstroms | 1st implant | 2nd implant | Rs after RTP anneal, ohms/square | | | |
|---|---|---|---|---|---|---|---|
| | | | | 0 | 1 | 2 | 3 |
| 1 | 700 | $N^{4,9}$ | $N^{6,9}$ | 2.41 | 2.93 | 3.90 | 5.49 |
| 2 | 650 | $N^{4,9}$ | $N^{6,9}$ | 1.90 | 2.22 | 3.18 | 4.96 |
| 3 | 700 | $N^{4,9}$ | $P^{1,9}$ | 2.36 | 2.83 | 3.68 | 5.15 |
| C1 | 700 | $W^{2,7}$ | | 2.34 | 4.89 | 7.29 | 10.39 |
| C2 | 700 | $Co^{6,7}$ | | 2.55 | 4.06 | 5.72 | 8.06 |
| C3 | 700 | $Co^{6,8}$ | | 2.32 | 4.17 | 6.16 | 8.91 |
| C4 | 430 | $W^{2,7}$ | | 3.90 | 10.48 | 18.54 | 37.67 |
| C5 | 430 | $W^{2,10}$ | | 3.88 | 8.80 | 14.24 | 23.17 |
| C6 | 430 | $Mo^{3,7}$ | | 3.75 | 9.69 | 16.73 | 34.28 |
| C7 | 420 | $Co^{5,7}$ | | 4.13 | 10.03 | 15.73 | 27.17 |

$^1$60 KeV, $^2$50KeV, $^3$45KeV, $^4$22KeV, $^5$15KeV, $^6$12KeV, $^7$1E14/$cm^2$, $^8$5E12/$cm^2$, $^9$2E13/$cm^2$, $^{10}$2E12/$cm^2$

The present invention may be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes that come within the meaning and range of equivalency of the claims are to be embraced within their scope.

What is claimed and desired to be secured by United States Letters Patent is:

1. An implantation method comprising:
   implanting ions into a silicon-containing material to a first depth;
   implanting ions into the silicon-containing material to a second depth less than the first depth, wherein the ions implanted to the first depth and the ions implanted to the second depth both consist of elements selected from the group consisting of P, N, Co, W, and Mo and combinations thereof;
   forming a refractory metal silicide from the silicon-containing material to the first depth.

2. The method as defined in claim 1, wherein the silicon-containing material is selected from the group consisting of monocrystalline silicon, amorphous silicon, and polysilicon.

3. The method as defined in claim 2, wherein the silicon-containing material is above and on an insulator layer.

4. The method as defined in claim 2, wherein the silicon-containing material is above and on a silicon substrate.

5. The method as defined in claim 1, further comprising forming the silicon-containing material at a temperature in a range of about 50° C. to about 900° C. by use of techniques selected from the group consisting of LPCVD, PECVD, APCVD, and sputtering.

6. The method as defined in claim 1, wherein the refractory metal of the refractory metal silicide is selected from the group consisting of Ti, W, Co, and Mo and combinations thereof.

7. The method as defined in claim 1, wherein the silicon-containing material is above and on an insulator layer.

8. The method as defined in claim 1, wherein the ions implanted to the first depth comprise phosphorus ions, and the ions implanted to the second depth comprise nitrogen ions.

9. The method as defined in claim 1, wherein forming said refractory metal silicide comprises:
   heat treating the silicon-containing material with a metallization layer to react said metallization layer with the silicon-containing material.

10. The method as defined in claim 9, wherein said heat treating is a rapid thermal processing.

11. The method as defined in claim 10, wherein said rapid thermal processing is conducted in an atmosphere of nitrogen.

12. A method according to claim 1, wherein forming the refractory metal silicide comprises:
   depositing titanium by physical vapor deposition at a temperature in a range from about 100° C. to about 300° C. upon the silicon-containing material;
   reacting the silicon-containing material and the titanium.

13. An implantation method comprising:
   implanting ions into a silicon-containing material to a first depth, the silicon-containing material being selected from the group consisting of monocrystalline silicon, amorphous silicon, and polysilicon;
   implanting ions into the silicon-containing material to a second depth less than the first depth, wherein the ions implanted to the first depth and the ions implanted into a silicon-containing material to the second depth both consist of elements selected from the group consisting of P, N, Co, W, and Mo and combinations thereof;
   depositing a refractory metal layer upon the silicon-containing material;
   performing rapid thermal processing in an atmosphere of nitrogen to react the refractory metal layer with the silicon-containing material and form a refractory metal silicide therefrom that extends to the first depth, wherein the refractory metal of the refractory metal silicide is selected from the group consisting of Ti, W, Co, and Mo and combinations thereof.

14. An implantation method comprising:
   forming a device separation field oxide film on a portion of a silicon-containing material using a field oxidation process;
   forming on said silicon-containing material an insulating film and a silicon film above and on said insulating film;
   patterning said insulating film and said silicon film to form a gate insulating film and a gate above and on said gate insulating film, and to expose a portion of said silicon-containing material;
   forming an insulating side wall spacer on lateral sides of said gate insulating film and said gate, and in contact with said silicon-containing material;
   implanting ions into the gate to a first depth;
   implanting ions into the gate to a second depth less than the first depth, wherein the ions at the depth and at the second depth are selected from the group consisting of P, N, Co, W, and Mo and combinations thereof;
   forming a refractory metal silicide from the gate to the first depth and extending laterally upon said silicon-containing material between said side wall spacer and said device separation field oxide film, wherein the ions at the second depth are separated from the ions at the first depth and are situated below a top surface of the refractory metal silicide.

15. The method as defined in claim 14, wherein forming the refractory metal silicide comprises multiple heat treatments by rapid thermal processing.

16. The method as defined in claim 15, wherein said multiple heat treatments by rapid thermal processing are conducted in an atmosphere of nitrogen.

17. The method of claim 14, wherein said silicon film is a single layer of polycrystalline silicon film.

18. The method of claim 14, wherein the ions at the second depth comprise nitrogen.

19. The method of claim 14, wherein the ions at the first depth comprise phosphorus.

20. The method according to claim 14, wherein:
the field oxide film has a thickness in a range from about 1,000 Å to about 3,000 Å;
the insulating film has a thickness in a range from about 50 Å to about 150 Å;
the silicon film has a thickness in a range from about 1,000 Å to about 2,000 Å;
the first depth is in a range from about 200 Å to about 1,000 Å; and
the refractory metal silicide has a thickness in a range from about 500 Å to about 2,000 Å.

21. The method according to claim 14, wherein forming the refractory metal silicide comprises multiple heat treatments.

22. An implantation method comprising:
forming a device separation field oxide film on a portion of a silicon-containing material using a field oxidation process;
forming on said silicon-containing material an insulating film and a silicon film above and on said insulating film;
implanting ions into the silicon film to a first depth;
implanting ions into the silicon film to a second depth less than the first depth, wherein both the ions implanted to the first depth and the ions implanted to the second depth are selected from the group consisting of P, N, Co, W, and Mo, and combinations thereof;
patterning said insulating film and said silicon film to form a gate insulating film and a gate above and on said gate insulating film, and to expose a portion of the silicon-containing material;
forming an insulating side wall spacer on lateral sides of said gate insulating film and said gate, and in contact with the silicon-containing material;
forming a refractory metal silicide to the first depth and extending laterally upon said silicon-containing material between said side wall spacer and said device separation field oxide film, wherein the ions at the second depth is separated from the ions at the first depth and are situated below a top surface of the refractory metal silicide.

23. The method as defined in claim 22, wherein forming the refractory metal silicide comprises:
depositing a refractory metal film on the silicon film and the gate;
applying a heat treatment process to form the refractory metal silicide film by rapid thermal processing.

24. The method as defined in claim 23, wherein said rapid thermal processing is conducted in an atmosphere of nitrogen.

25. The method of claim 22 wherein said silicon film is a single layer of polycrystalline silicon film.

26. The method of claim 22, wherein the ions implanted to the second depth comprise nitrogen ions.

27. The method of claim 22, wherein the ions implanted to the first depth comprise phosphorus ions.

28. A method according to claim 22, wherein:
the field oxide film has a thickness in a range from about 1,000 Å to about 3,000 Å;
the insulating film has a thickness in a range from about 50 Å to about 150 Å;
the silicon film has a thickness in a range from about 1,000 Å to about 2,000 Å;
the first depth is in a range from about 200 Å to about 1,000 Å;
and the refractory metal silicide has a thickness in a range from about 500 Å to about 2,000 Å.

29. A method according to claim 22, wherein forming the refractory metal silicide is conducted in a heated atmosphere.

30. An implantation method comprising:
forming a device separation field oxide film on a portion of a silicon-containing material using a field oxidation process, wherein the field oxide film has a thickness in a range from about 1,000 Å to about 3,000 Å;
forming on said silicon-containing material an insulating film and a polysilicon film above and on said insulating film, wherein the insulating film has a thickness in a range from about 50 Å to about 150 Å and the polysilicon film has a thickness in a range from about 1,000 Å to about 2,000 Å;
implanting ions into the polysilicon film to a first depth;
implanting ions into the polysilicon film to a second depth less than the first depth in a range from about 200 Å to about 1,000 Å, wherein both the ions implanted to the first depth and the ions implanted to the second depth are selected from the group consisting of P, N, Co, W, and Mo, and combinations thereof;
patterning said insulating film and said polysilicon film to form a gate insulating film and a gate above and on said gate insulating film, and to expose a portion of the silicon-containing material;
forming an insulating side wall spacer on lateral sides of said gate insulating film and said gate and in contact with the silicon-containing material;
depositing a refractory metal film on the silicon-containing material and said gate;
performing rapid thermal processing in an atmosphere of nitrogen to form a refractory metal silicide to the first depth and extending laterally upon said silicon-containing material between said side wall spacer and said device separation field oxide film, wherein the ions at the second depth are separated from the ions at the first depth and are situated below a top surface of the refractory metal silicide.

* * * * *